(12) United States Patent
Sognefest et al.

(10) Patent No.: US 6,909,100 B2
(45) Date of Patent: Jun. 21, 2005

(54) RADIATION DETECTOR ASSEMBLY

(75) Inventors: Peter W. Sognefest, Mequon, WI (US); S. Kumar Khanna, Carmel, IN (US); Fernando A. Ferraro, New Kensington, PA (US)

(73) Assignees: II-VI Incorporated, Saxonburg, PA (US); Nexaura Systems, LLC, Carmel, IN (US)

( * ) Notice: Subject to any disclaimer, the term of this patent is extended or adjusted under 35 U.S.C. 154(b) by 161 days.

(21) Appl. No.: 10/358,071

(22) Filed: Feb. 4, 2003

(65) Prior Publication Data

US 2004/0016913 A1 Jan. 29, 2004

Related U.S. Application Data

(63) Continuation-in-part of application No. 10/205,251, filed on Jul. 25, 2002, now Pat. No. 6,838,022, which is a continuation-in-part of application No. 10/205,515, filed on Jul. 25, 2002, now Pat. No. 6,733,613.

(51) Int. Cl.7 .............................. H01B 1/00; H01C 1/00
(52) U.S. Cl. .................................. 250/370.13; 252/500
(58) Field of Search .................. 250/370.01, 370.08, 250/370.09, 370.11, 370.12, 370.13; 252/500

(56) References Cited

U.S. PATENT DOCUMENTS

| | | |
|---|---|---|
| 4,170,677 A | 10/1979 | Hutcheson |
| 4,568,592 A | 2/1986 | Kawaguchi et al. |
| 4,588,261 A * | 5/1986 | Erhardt ....................... 257/432 |
| 4,772,422 A | 9/1988 | Hijikata et al. |
| 4,878,978 A | 11/1989 | Goel et al. |
| 4,966,729 A | 10/1990 | Carmona et al. |
| 5,162,087 A | 11/1992 | Fukuzawa et al. |
| 5,169,471 A | 12/1992 | Strasser |
| 5,236,631 A | 8/1993 | Osawa |
| 5,286,417 A | 2/1994 | Mahmoud et al. |
| 5,429,701 A | 7/1995 | Lu |
| 5,453,148 A | 9/1995 | Lu et al. |
| 5,522,962 A | 6/1996 | Koskenmaki et al. |
| 5,739,887 A * | 4/1998 | Ueda et al. ................. 349/149 |
| 5,769,996 A | 6/1998 | McArdle et al. |
| 5,785,913 A | 7/1998 | Clark, Jr. et al. |
| 5,793,047 A * | 8/1998 | Kobayashi et al. .... 250/370.09 |
| 5,840,215 A | 11/1998 | Iyer et al. |
| 5,851,644 A | 12/1998 | McArdle et al. |
| 5,891,366 A | 4/1999 | Gruenwald et al. |
| 5,965,064 A | 10/1999 | Yamada et al. |
| 6,039,896 A | 3/2000 | Miyamoto et al. |
| 6,048,599 A | 4/2000 | Chu et al. |
| 6,110,399 A | 8/2000 | McArdle et al. |
| 6,149,857 A | 11/2000 | McArdle et al. |
| 6,171,107 B1 | 1/2001 | Milne |
| 6,392,217 B1 * | 5/2002 | Teranuma et al. ....... 250/208.1 |
| 6,512,233 B1 * | 1/2003 | Sato et al. ............. 250/370.13 |

* cited by examiner

*Primary Examiner*—David Porta
*Assistant Examiner*—Faye Polyzos
(74) *Attorney, Agent, or Firm*—The Webb Law Firm

(57) ABSTRACT

A semiconductor radiation detection crystal converts incident radiation or an incident particle into an electrical signal. A first substrate for conveying the electrical signal to processing electronics is bonded to the crystal via an anisotropic conductive material sandwiched therebetween. The crystal can include can array of pixels which are positioned in opposition with an array of conductive pads formed on the first substrate. The anisotropic conductive material forms between each pixel and its corresponding conductive pad an electrical path, with each electrical path isolated from other electrical paths.

59 Claims, 9 Drawing Sheets

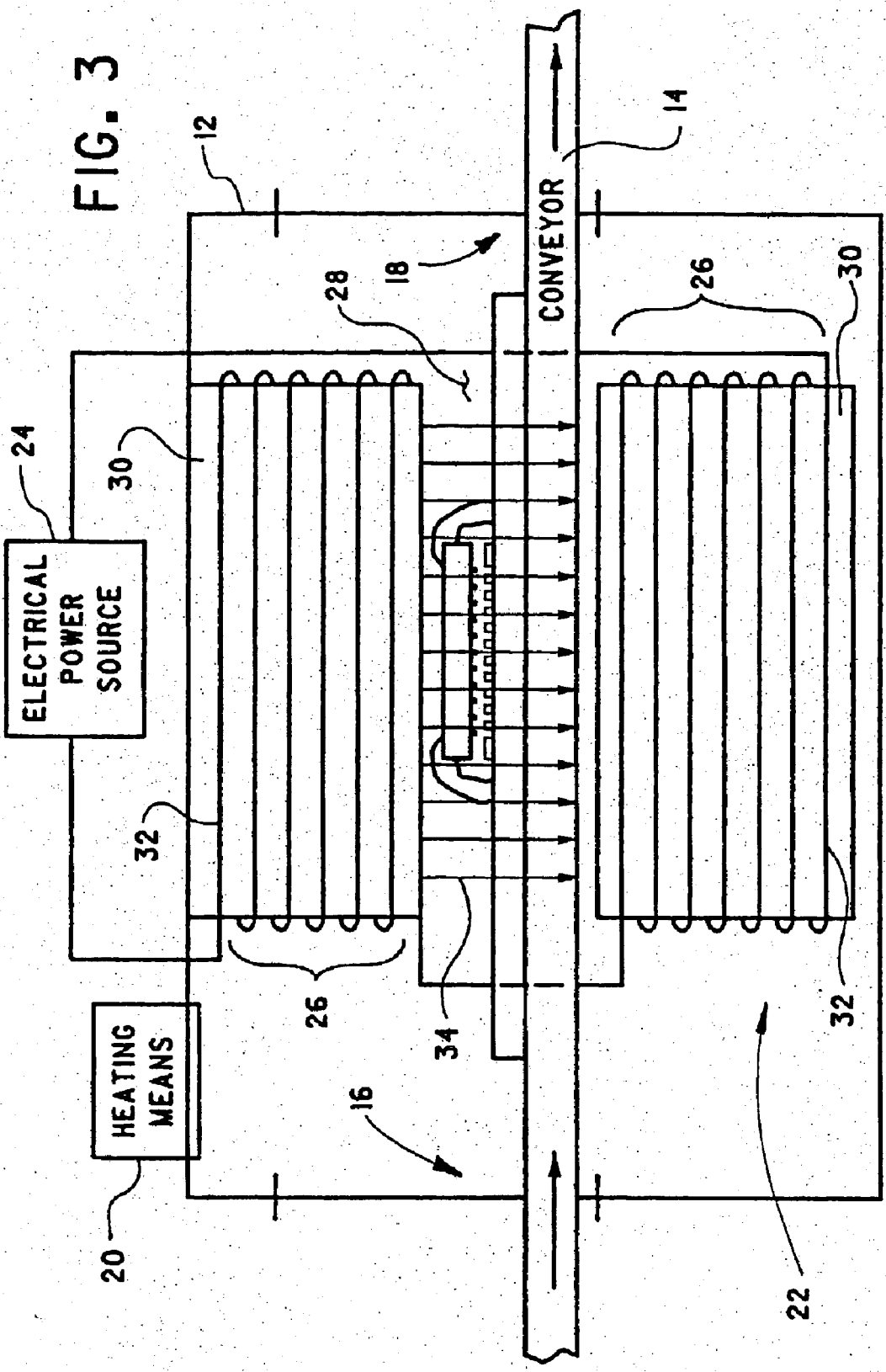

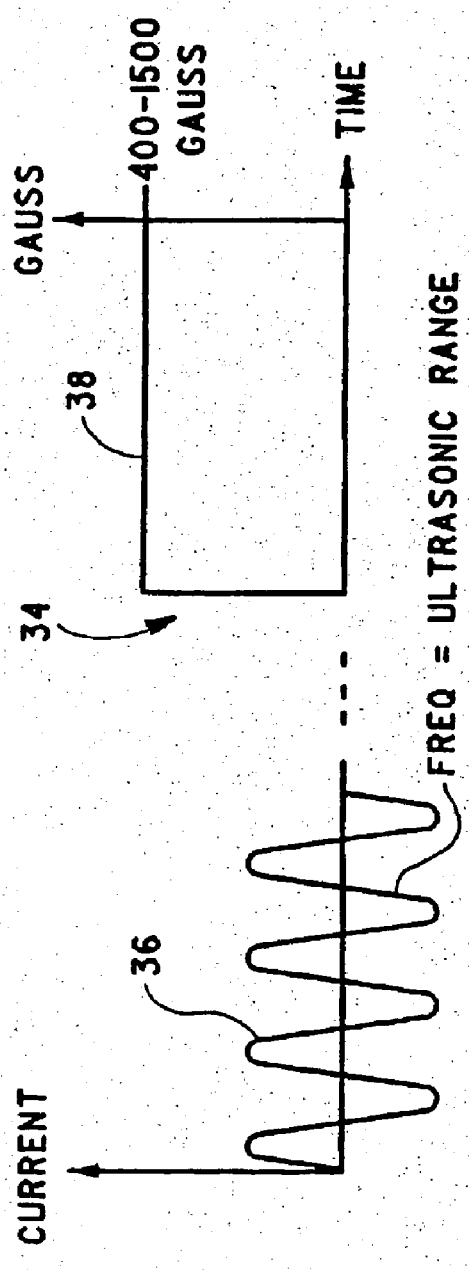
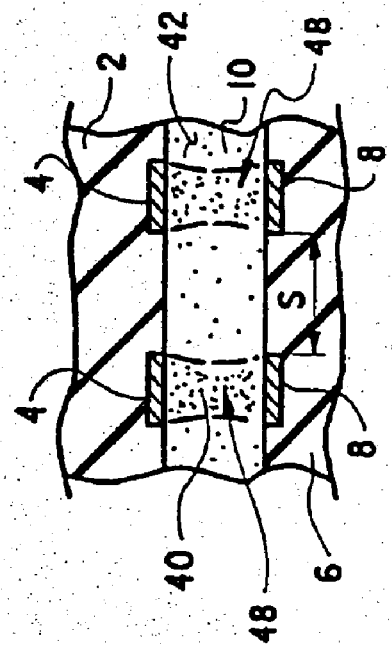
FIG. 4
FIG. 5

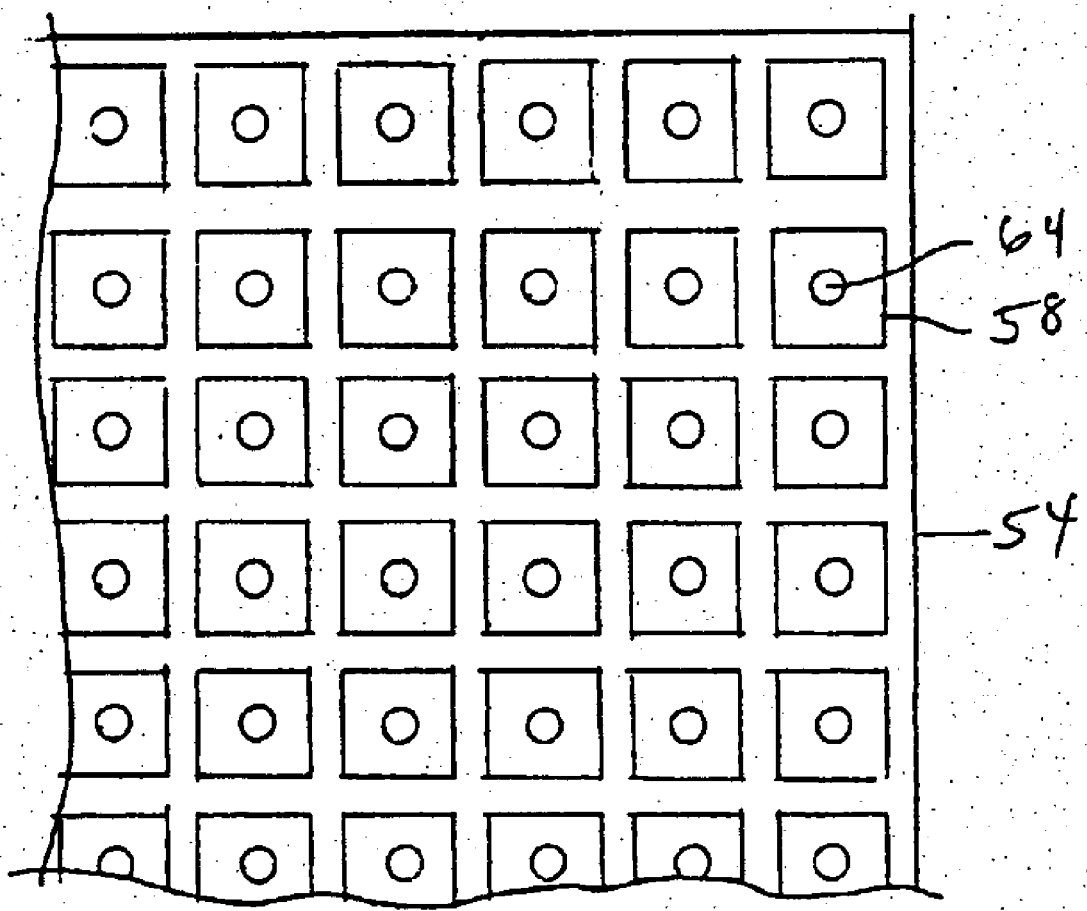

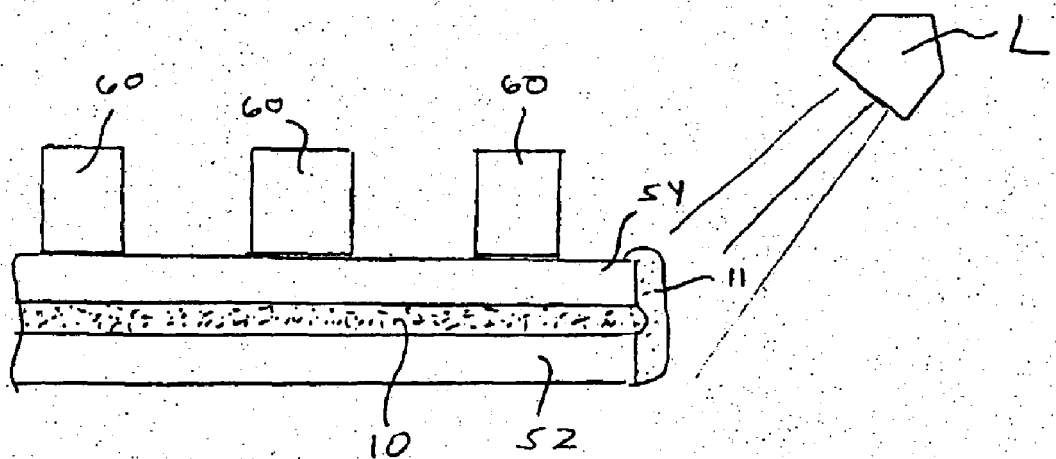

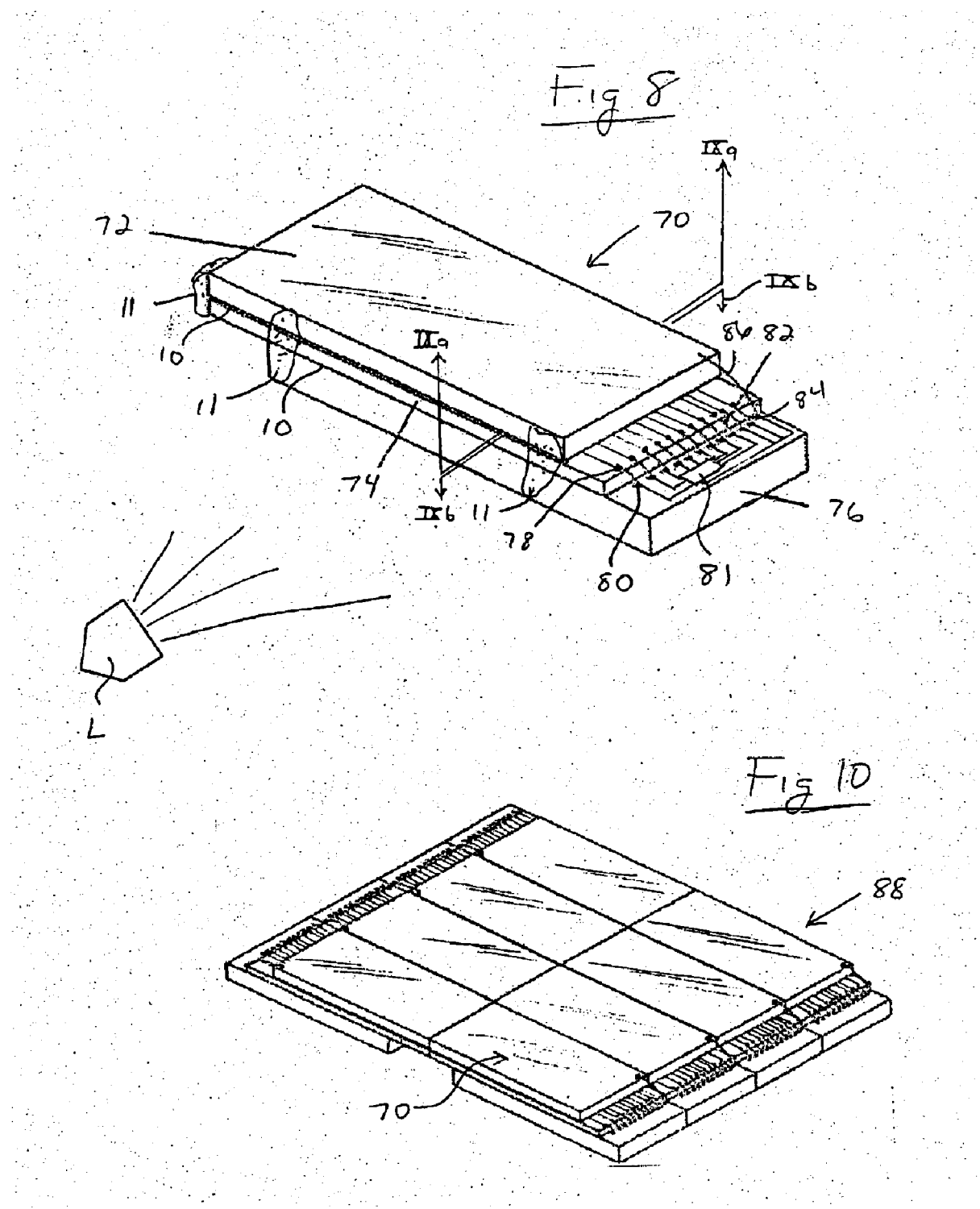

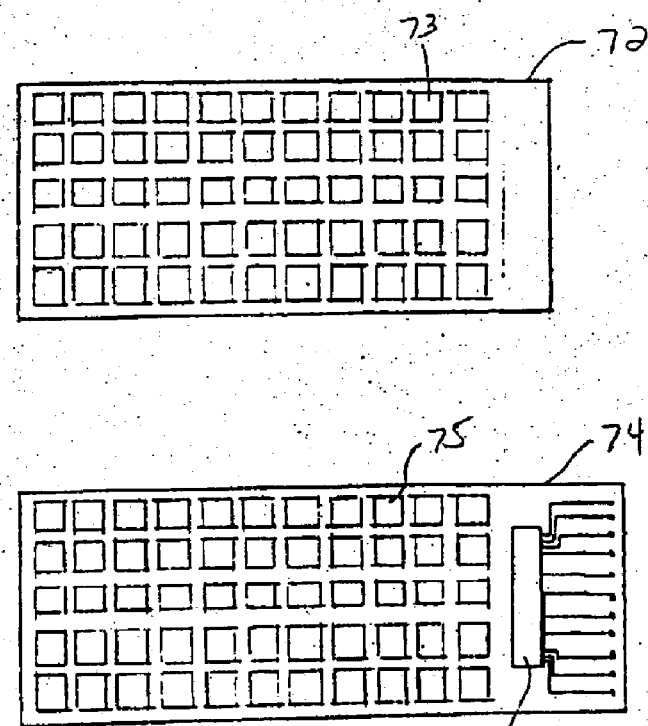

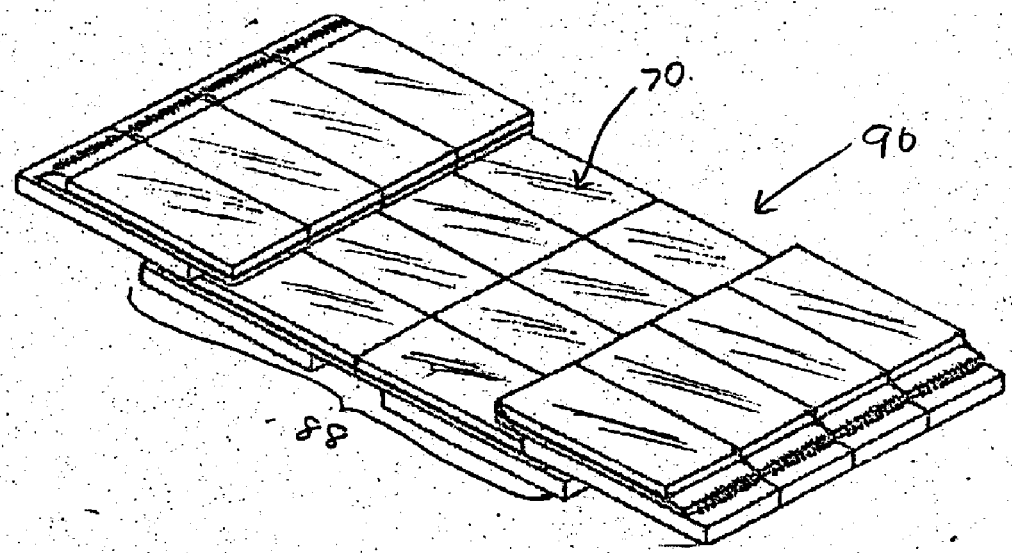

RADIATION DETECTOR ASSEMBLY

CROSS REFERENCE TO RELATED APPLICATIONS

The present application is a continuation-in-part of U.S. patent application Ser. No. 10/205,251, filed Jul. 25, 2002, now U.S. Pat. No. 6,838,022, entitled "Anisotropic Conductive Compound" and U.S. patent application Ser. No. 10/205,515, filed Jul. 25, 2002, now U.S. Pat. No. 6,733, 613, entitled "Method Of Curing An Anisotropic Conductive Compound".

BACKGROUND OF THE INVENTION

1. Field of the Invention

The present invention relates to radiation detectors having processing electronics in electrical communication therewith and a method of coupling the processing electronics in electrical communication with the radiation detectors.

2. Description of Related Art

Anisotropic conductive compounds are utilized to form conductive paths between pairs of aligned contacts, such as a contact on an integrated circuit or integrated circuit package and a contact of a printed circuit board or other substrate. A typical anisotropic conductive compound includes conductive particles suspended in a binder. Such anisotropic conductive compound can be interposed in an uncured state between the integrated circuit or integrated circuit package and the substrate whereafter the anisotropic conductive compound can be cured to form conductive paths between contacts on the integrated circuit or integrated circuit package and the substrate while, at the same time, bonding the integrated circuit or integrated circuit package to the substrate.

Heretofore, anisotropic conductive compounds of the type described above were formed into a film which was interposed between the integrated circuit or integrated package and the substrate whereupon, with the application of pressure between the integrated circuit or integrated circuit package and the substrate in the presence of a curing heat, the conductive paths were formed between aligned contacts of the integrated circuit or integrated circuit package and substrate, and the bonding of the integrated circuit or integrated circuit package to the substrate occurs.

A problem with prior art anisotropic conductive compounds is that they require the use of pressure and curing heat in order to form the conductive paths at the same time the bond is formed between the integrated circuit or integrated circuit package and the substrate. Another problem is that the film form of the prior art anisotropic conductive compounds requires special machinery in order to utilize the film in a production environment. Still another problem is that the prior art anisotropic conductive compounds cannot effectively be utilized with integrated circuits, integrated circuit packages or substrates having adjacent contacts with edge-to-edge spacings less than about 300 μm.

It is, therefore, desirable to overcome the above problems and others by providing an improved anisotropic conductive compound and a method of curing thereof. Still other desirable features will become apparent to those of ordinary skill in the art upon reading and understanding the following detailed description.

SUMMARY OF THE INVENTION

The invention is a radiation detector assembly that includes a semiconductor radiation detection crystal for converting incident radiation or an incident particle into an electrical signal. A first substrate for conveying the electrical signal to processing electronics is coupled to the crystal via anisotropic conductive material sandwiched between the crystal and the first substrate. The anisotropic conductive material includes an electrically conducting material suspended in a binder formed from the reaction product of one of (i) a catalyst in a compound comprising about one-third by weight of each of an aromatic epoxy resin, a dimer fatty acid diglycidyl ester and an oxirane, (ii) a phenolic resin, a catalyst and a thermally polymerized aromatic epoxy resin and (iii) a pheolic resin, a catalyst and a phenoxy modified epoxy novalac resin.

The crystal can define on a surface thereof an array of pixels, with each pixel responsive to incident radiation or an incident particle for producing a corresponding electrical signal. The first substrate can include on a surface thereof an array of conductive pads. The surface of the crystal and the surface of the first substrate can be positioned in opposition with the anisotropic conductive material sandwiched therebetween and with each pixel in alignment with the corresponding conductive pad. The anisotropic conductive material forms between each pixel and its corresponding conductive pad an electrical path. Each electrical path is isolated from other electrical paths.

The first substrate can be one of a printed circuit board and an integrated circuit. The printed circuit board or the integrated circuit can include the processing electronics deposited or formed thereon, respectively.

A second substrate can be received on a side of the integrated circuit opposite the crystal with anisotropic conductive material sandwiched between the second substrate and the integrated circuit. The second substrate can include contact pads electrically contacted to contact or wire bonding pads formed on the integrated circuit. The crystal can be positioned in opposition with a top surface of the integrated circuit and the second substrate can be positioned in opposition with a bottom surface of the integrated circuit. Wire bonds form the electrical connections between the contact pads of the second substrate and the contact pads of the integrated circuit.

The crystal is preferably formed from one of cadmium zinc telluride, cadmium telluride, zinc telluride, mercuric iodide, lead iodide and germanium.

The incident radiation can be x-radiation or gamma radiation. The incident particle can be an alpha particle or a beta particle.

The invention is also a radiation detector assembly that includes a semiconductor radiation detection crystal for converting incident radiation or an incident particle into an electrical signal and a first substrate for conveying the electrical signal to processing electronics. Anisotropic conductive material is sandwiched between the crystal and the first substrate for conducting the electrical signal from the crystal to the substrate. The anisotropic conductive material includes electrically conducting material suspended in a binder. The electrically conducting material includes at least one of (i) nickel coated particles having a coating of silver or gold over the nickel coat or (ii) gold or silver coated nickel particles. The particles having the nickel and gold or silver coatings can include carbon-graphite spheres, glass spheres and/or mica particles.

Lastly, the invention is a radiation detector assembly that includes means for converting incident radiation or an incident particle into an electrical signal and means for conveying the electrical signal to means for processing said electrical signal. Means is sandwiched between said converting means and said conveying means for conducting said electrical signal from said converting means to said conveying means. Said conducting means includes electrically conducting materials suspended in a binder.

The converting means can include plural elements each responsive to radiation or a particle incident thereon for producing a corresponding electrical signal. The conveying means can also include plural elements. The plural converting means elements and the plural conveying means elements can be positioned in opposition, with each converting means element in alignment with a corresponding conveying means element. The conducting means can form between each converting means element and its corresponding conveying means element an electrical path, with each electrical path isolated from other electrical paths.

The conveying means can be a printed circuit board or an integrated circuit. The integrated circuit can include the processing means or the processing means can be included on the printed circuit board.

The assembly can further include means for supporting the conveying means, with said supporting means positioned on a side of said conveying means opposite said converting means. Second conducting means can be sandwiched between the supporting means and the conveying means for electrically connecting the supporting means and the conveying means.

Said supporting means can include first elements electrically connected to second elements formed on said conveying means. The converting means can be positioned in opposition with one surface of the conveying means and the supporting means can be positioned in opposition with another surface of the converting means. Conductive wires can form the electrical connections between the first and second elements.

BRIEF DESCRIPTION OF THE DRAWINGS

FIG. 3 is a schematic representation of a curing oven having a magnetic field generator therein for curing the anisotropic conductive material sandwiched between the integrated circuit package and the substrate in FIG. 2b;

FIG. 4 is a plot of current versus time and field strength versus time for the current through the windings of the magnetic field generator and the magnetic field produced thereby, respectively, in FIG. 3;

FIG. 5 is an close-up isolated diagrammatic cross-section of a pair of isolated parallel conductive paths of cured anisotropic conductive material showing the distribution of the electrically conducting material in the binder;

FIG. 6b is a view taken along lines VIb—VIb in FIG. 6a;

FIG. 7 is an assembled end view of the first embodiment radiation detector shown in FIG. 6a;

FIG. 8 is a perspective view of a second embodiment radiation detector in accordance with the present invention;

FIG. 9a is a view taken along lines IXa—IXa in FIG. 8;

FIG. 9b is a view taken along lines IXb—IXb in FIG. 8;

FIG. 10 is a perspective view of a large area radiation detector formed from a plurality of second embodiment radiation detectors shown in FIG. 8; and FIG. 11 is a perspective view of a larger area radiation detector formed from a plurality of second embodiment radiation detectors shown in FIG. 8.

DETAILED DESCRIPTION OF THE INVENTION

Figure 1:
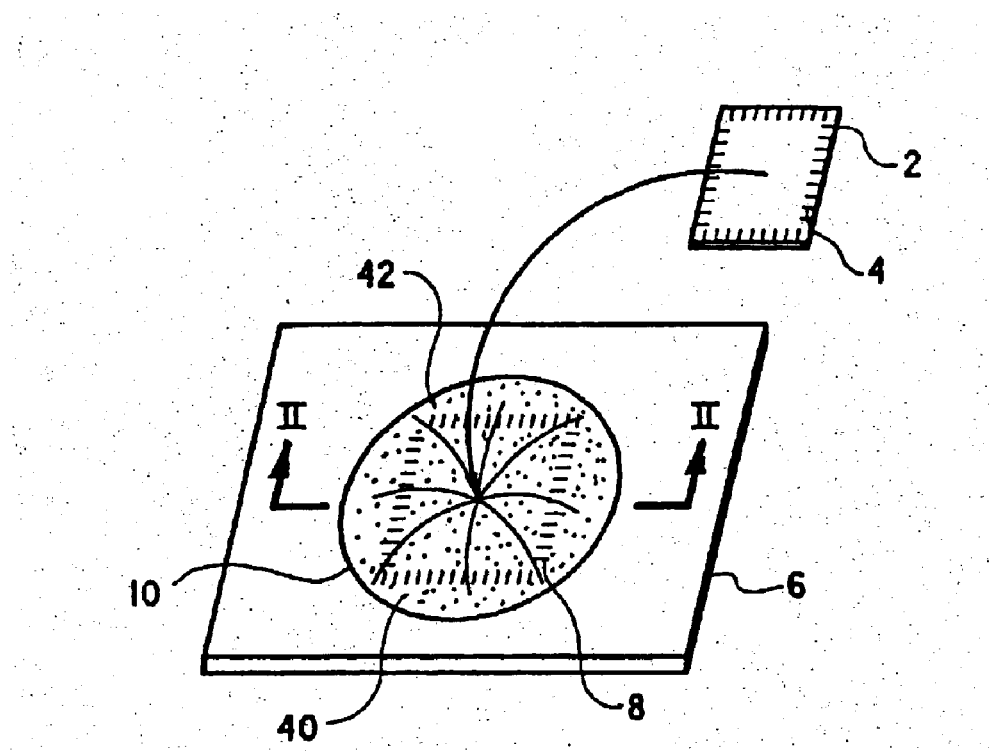
FIG. 1 is a perspective view of the positioning of an integrated circuit package on an anisotropic conductive material deposited on a substrate.

The present invention is a radiation detector assembly and a method of manufacture thereof. The invention will first be described in connection with a method of curing an anisotropic conductive material utilized to bond an integrated circuit or integrated circuit package to a substrate followed by descriptions of first and second radiation detector embodiments and a description of exemplary anisotropic conductive materials that have been found to be particularly suitable for use in forming conductive paths between conductive contacts of the integrated circuit, the integrated circuit package or a radiation detection crystal and conductive contacts on a substrate in alignment with the conductive contacts on the integrated circuit, integrated circuit package or radiation detection crystal while avoiding shorts between adjacent conductive paths. The material is particularly suitable for creating isolated conductive paths between contacts of an integrated circuit or integrated circuit package and contacts of a substrate having an edge-to-edge spacing less than 250 μm and as small as about 80 μm to 100 μm. An advantage of the method of curing is that the anisotropic conductive material does not require pressure to be applied between the integrated circuit or integrated circuit package and the substrate. Rather, the weight of the integrated circuit, integrated circuit package, radiation detection crystal or substrate acting upon the anisotropic conductive material in combination with the method for curing the anisotropic conductive material described hereinafter is sufficient to create conductive paths between contacts of the integrated circuit, integrated circuit package or radiation detection crystal and contacts on the substrate in alignment therewith while avoiding electrical shorting between adjacent conductive paths.

Other than in the operating examples, or where otherwise indicated, all numbers expressing quantities of ingredients, reaction conditions and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present invention.

Also, it should be understood that any numerical range recited herein is intended to include all sub-ranges subsumed therein. For example, a range of "1 to 10" is intended to include all sub-ranges between and including the recited minimum value of 1 and the recited maximum value of 10, that is, having a minimum value equal to or greater than 1 and a maximum value of equal to or less than 10. Because the disclosed numerical ranges are continuous, they include every value between the minimum and maximum values. Unless expressly indicated otherwise, the various numerical ranges specified in this application are approximations.

As used herein, the term "polymer" is meant to encompass oligomers, and includes without limitation both homopolymers and copolymers. As used herein, "(meth)

acrylate" and like terms are intended to include both acrylates and methacrylates.

As used herein the term aryl refers to aromatic groups that include, without limitation, groups such as phenyl, biphenyl, benzyl, xylyl, napthalenyl, anthracenyl and the like, as well as heterocyclic aromatic groups that include, without limitation, pyridinyl, pyrrolyl, furanyl, thiophenyl, and the like.

With reference to FIG. 1, an integrated circuit package 2 includes a plurality of closely spaced contacts positioned on or adjacent the edges of package 2. In FIG. 1, package 2 is illustrated as a leadless chip carrier package. However, this is not to be construed as limiting the invention since use of the anisotropic conductive material with other surface mount integrated circuit packages, such as ball grid arrays, dual inline or quad packages having gull-wing or j-shaped leads, and quad flat packs having laterally extending leads or any other form of integrated circuit package 2 having closely spaced leads, is envisioned. In addition, use of the anisotropic conductive material with unpackaged integrated circuits for flip-chip mounting thereof is also envisioned.

As shown in FIG. 1, integrated circuit package 2 is received on a substrate 6 having a plurality of closely spaced contacts 8 disposed in mirror image relation to contacts 4 of integrated circuit package 2. Prior to mounting integrated circuit package 2 on substrate 6, a drop or coating of uncured anisotropic conductive material 10 is deposited on substrate 6 over the plurality of contacts 8.

Figure 2A:
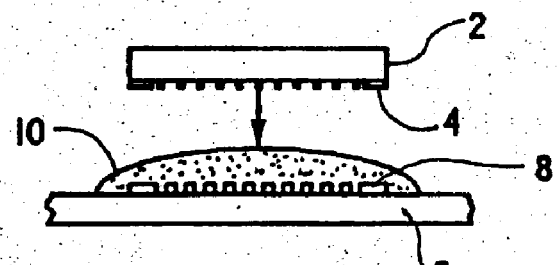
FIG. 2a is a view of the integrated circuit package in spaced relation to the substrate and conductive material taken along section lines II—II in FIG. 1.
Figure 2B:
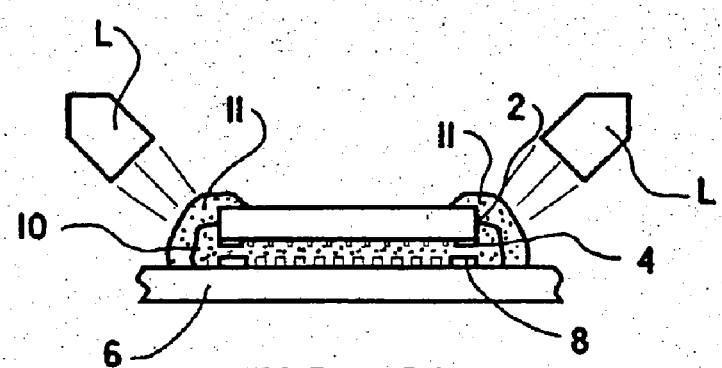
FIG. 2b is a view of the integrated circuit package in contact with the anisotropic conductive material deposited on the substrate taken along section lines II—II in FIG. 1.

With reference to FIGS. 2a and 2b, and with continuing reference to FIG. 1, next, integrated circuit package 2 is positioned with its contacts 4 in opposition with contacts 8 of substrate 6. More specifically, each contact 4 of integrated circuit package 2 is positioned in alignment with a corresponding contact 8 of substrate 6. Thereafter, as shown in FIG. 2b, integrated circuit package 2 is moved into contact with anisotropic conductive material 10. In response to this contact, anisotropic conductive material 10 displaces somewhat. However, the viscosity of anistropic conductive material 10 is such that contacts 4 of integrated circuit package 2 and contacts 8 of substrate 6 are maintained in spaced relation by anisotropic conductive material 10. Importantly, integrated circuit package 2 is moved into contact with anisotropic conductive material 10 in a manner so that contacts 4 of integrated circuit package 2 and contacts 8 of substrate 6 are not in physical contact with each other and the displacement of anisotropic conductive material 10 is due primarily to the weight of integrated circuit package 2, and only slightly due to the force utilized to move integrated circuit package 2 into contact with anisotropic conductive material 10.

After integrated circuit package 2 is deposited on anisotropic conductive material 10 with each contact 4 in alignment with a corresponding contact 8 of substrate 6, a UV curable adhesive 11 is deposited between substrate 6 and integrated circuit package 2. UV curable adhesive 11 can be deposited around the perimeter of integrated circuit package 2. However, in practice, it is only necessary to deposit UV curable adhesive 11 on two or more corners of integrated circuit package 2.

After UV curable adhesive 11 has been deposited, it is exposed to UV light from one or more light sources L for a sufficient interval to cause UV curable adhesive 11 to commence curing. In addition, if anisotropic conductive material 10 includes a UV curable component, exposure to the UV light from the one or more light sources L also causes this component to commence curing. Optionally, instead of using UV curable adhesive 11, another form of adhesive that can be cured independent of anisotropic conductive material 10 can be utilized. However, UV curable adhesive 11 is preferred since it can be cured without exposing it and anisotropic conductive material 10 to an elevated curing temperature.

With reference to FIG. 3, and with ongoing reference to all previous Figs., after UV curable adhesive 11 has cured, the entire assembly, including integrated circuit 2, substrate 6 and anisotropic conductive material 10, is positioned in a curing oven 12. In a production environment, curing oven 12 can have a conveyor 14 which extends through curing oven 12 between an inlet 16 and outlet 18 thereof for transporting the assembly therethrough. Alternatively, curing oven 12 can be an enclosure of any suitable shape and size in which the assembly can be positioned.

Curing oven 12 includes a heating means 20 for heating the atmosphere, e.g., air, inside of curing oven 12 in a manner known in the art. Curing oven 12 also includes a magnetic field generator 22 disposed therein which is coupled to and controlled by an electrical power source 24 disposed external to curing oven 12. Magnetic field generator 22 includes a pair of poles 26 disposed in spaced relation across a gap 28 in which integrated circuit package 2 deposited on anisotropic conductive material 10 received on substrate 6 is positioned in or passes through on conveyor 14. Each pole 26 includes a pole element 30 of ferromagnetic or paramagnetic material having one or more windings 32 of wire or other suitable conductive material formed therearound in a manner known in the art. Windings 32 are electrically insulated from pole elements 30 by a suitable insulator on pole elements 30 and/or a suitable insulator around the wire or other conductive material forming windings 32. Windings 32 of each pole 26 are connected to each other and to electrical power source 24 in a manner whereupon, in response to electrical power source 24 supplying windings 32 with a suitable electrical current, a magnetic field 34 is generated across gap 28.

Poles 26 are configured so that magnetic field 34 is highly homogeneous, at least where integrated circuit package 2 received on anisotropic conductive material 10 deposited on substrate 6 is positioned in curing oven 12 during curing of anisotropic conductive material 10. Magnetic field 34 preferably has a homogeneity of greater than 98.5%, but can have a homogeneity as low as 95%.

With reference to FIG. 4, and with continuing reference to all previous Figs., initially electrical power source 24 applies an alternating current signal 36 to windings 32 for a duration between 15 and 30 seconds followed by a direct current signal 38 for the remainder of the curing time of anisotropic conductive material 10. The amplitude of alternating current signal 36 can be selected based on the sizes of particles (discussed hereinafter) forming anisotropic conductive material 10. The amplitude of alternating current signal 36 is selected so that magnetic field 34 has an alternating magnetic field strength between 10 and 100 gauss. The value of direct current signal 38 is selected so that magnetic field 34 has a static magnetic field strength between 400 and 1,500 gauss.

Magnetic field 34 includes the alternating magnetic field produced by magnetic field generator 22 in response to alternating current signal 36 and the static magnetic field produced by magnetic field generator 22 in response to direct current signal 38. It has been observed that alternating current signal 36 operating in the ultrasonic frequency range, namely, between about 20 kHz and about 500 kHz, works best with anisotropic conductive material 10. However, this is not to be construed as limiting the present invention since other frequencies outside of the ultrasonic frequency range can also be utilized.

At a suitable time, the assembly is positioned in curing oven 12 in the presence of magnetic field 34. Curing oven 12 is heated or preheated to a suitable curing temperature for anisotropic conductive material 10 and the assembly is subjected to this curing temperature for a suitable curing interval while in the presence of magnetic field 34. Because of its nature, the curing temperature and the curing interval of anisotropic conductive material 10 can vary between 70° C. for about 30–60 minutes to 150° C. for about 5–7 minutes.

With reference to FIG. 5, and with continuing reference to all previous Figs., once cured to a solid, anisotropic conductive material 10 forms a conductive path between each contact 4 of integrated circuit package 2 and a corresponding contact 8 of substrate 6 in alignment therewith. It has been observed that cured anisotropic conductive material 10 can form electrically conductive, but isolated parallel conductive paths 48 between adjacent pairs of aligned contacts having an edge-to-edge spacing S as close as 80 µm. This is a vast improvement over prior art anisotropic conductive materials which, when cured, have difficulty maintaining electrical isolation between adjacent conductive paths between adjacent pairs of aligned contacts having an edge-to-edge spacing below 250 µm.

Figure 6A:
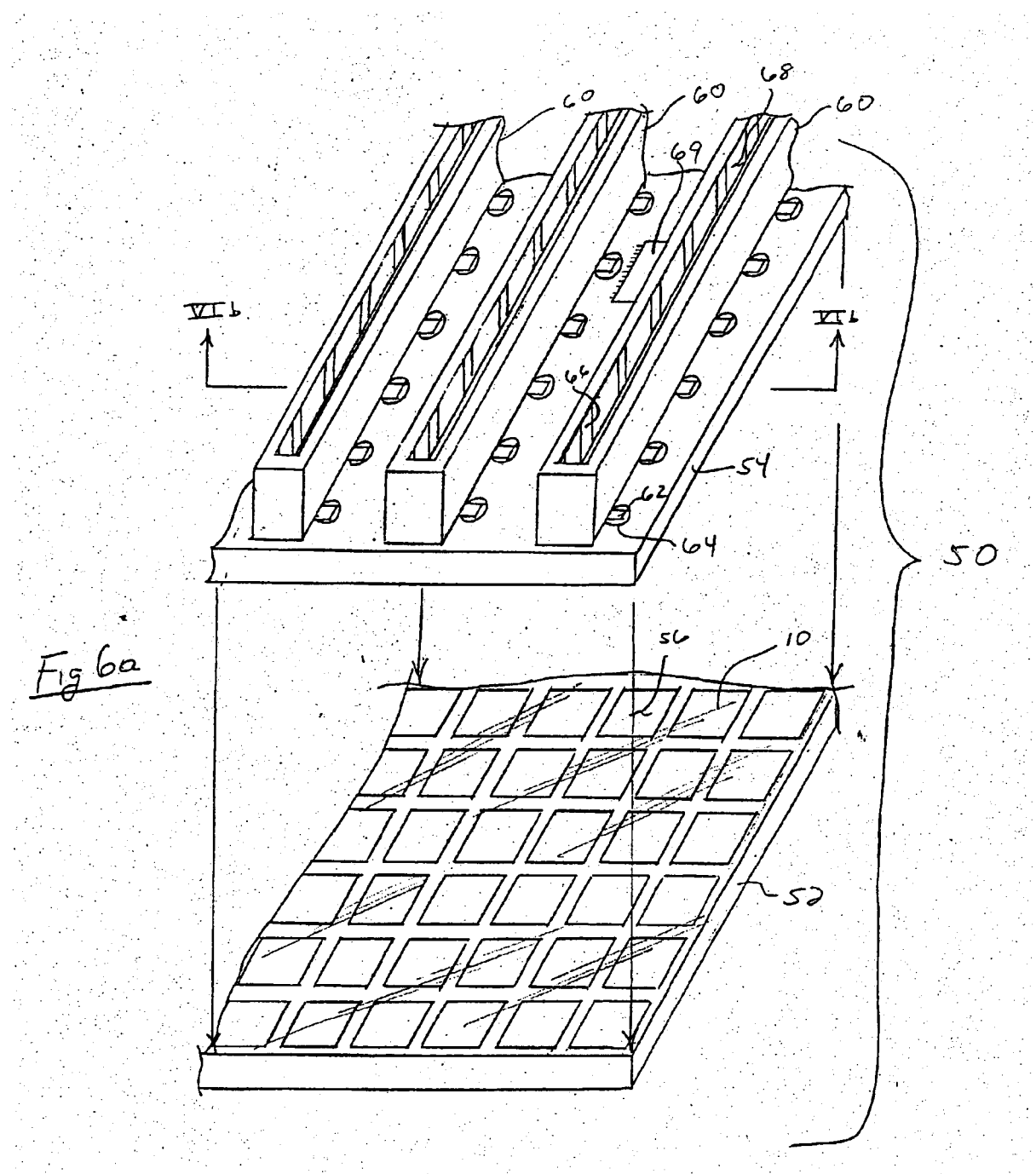
FIG. 6a is an exploded perspective view of a portion of a first embodiment radiation detector in accordance with the present invention.

With reference to FIGS. 6a and 6b, anisotropic conductive material 10 can also be utilized to form a first embodiment radiation detector 50 that includes a semiconductor radiation detection crystal 52 which is bonded to a substrate 54, such as a printed circuit board, via anisotropic conductive material 10. Semiconductor crystal 52 is preferably formed from one of cadmium zinc telluride (CZT)—with a zinc concentration from 0.001% to 99.999%; cadmium telluride (CT); zinc telluride (ZnTe); mercuric iodide (HgI); lead iodide (PbI); and germanium (Ge).

As shown in FIG. 6a, crystal 52 can be formed into a pixilated array where each picture element or pixel 56 is capable of converting incident radiation, such as x-rays and gamma rays, or incident particles, such as alpha or beta particles, into an electrical signal independent of each other pixel 56 of the array. Alternatively, crystal 52 can be a planar crystal that output an electrical signal in response to incident radiation or an incident particle, but which does not include individual pixels 56. An example of a planar crystal includes a single pixel 56 isolated from the remainder of crystal 52 shown in FIG. 6a. However, this is not to be construed as limiting the invention since a planar crystal can be formed of any desired and manufacturable size and shape. For simplicity of description, crystal 52 will be described as being pixilated. However, this is not to be construed as limiting the invention.

As shown in FIG. 6b, substrate 54 includes a plurality of conductive elements or pads 58 formed thereon in mirror image relation to pixels 56 of crystal 52. Prior to mounting substrate 54 on crystal 52, or vice versa, a coating of uncured anisotropic conductive material 10 is deposited over pixels 56 of crystal 52 or over conductive pads 58 of substrate 54.

With reference to FIG. 7, and with continuing reference to FIGS. 6a and 6b, next, substrate 54 is positioned with conductive pads 58 in opposition with pixels 56. More specifically, each conductive pad 58 of substrate 54 is positioned in alignment with a corresponding pixel 56 of crystal 52. Thereafter, as shown in FIG. 7, substrate 54 or crystal 52 is moved into contact with anisotropic conductive material 10. In response to this contact, anisotropic conductive material 10 displaces somewhat. However, the viscosity of anisotropic conductive material is such that conductive pads 58 of substrate 54 and pixels 56 of crystal 52 are maintained in spaced relation by anisotropic conductive material 10. The displacement of anisotropic conductive material 10 is due primarily to the weight of substrate 54 or crystal 52, and only slightly due to the force utilized to move substrate 54 or crystal 52 into contact with anisotropic conductive material 10.

After substrate 54 or crystal 52 is deposited on anisotropic conductive material 10 with each conductive pad 58 in alignment with a corresponding pixel 56, UV curable adhesive 11 can be deposited between substrate 54 and crystal 52. UV curable adhesive 11 can be deposited around the perimeter of substrate 54 and crystal 52. However, in practice, it is only necessary to deposit UV curable adhesive 2 across two or more corners or sides of substrate 54 and crystal 52.

After UV curable adhesive 11 has been deposited, it is exposed to UV light from one or more light sources L for a sufficient interval to cause UV curable adhesive 11 to commence curing. If anisotropic conductive material 10 includes a UV curable component, exposure to the UV light from the one or more light sources L also causes this component to commence curing. Optionally, instead of using UV curable adhesive 11, another form of adhesive that can be cured independent of anisotropic conductive material 10 can be utilized. However, UV curable adhesive 11 is preferred since it can be cured without exposing it and anisotropic conductive material 10 to an elevated temperature.

Once UV curable adhesive 11 has cured, the entire assembly, including substrate 54, crystal 52 and anisotropic conductive material 10 is positioned in curing oven 12 in the presence of magnetic field 34. Curing oven 12 is heated or preheated to a suitable curing temperature for anisotropic conductive material 10 and the assembly is subjected to this curing temperature for a suitable curing interval while in the presence of magnetic field 34.

Once cured to a solid, anisotropic conductive material 10 forms a conductive path between each conductive pad 58 of substrate 54 and corresponding pixel 56 of crystal 52 in alignment therewith.

To facilitate electrical connection with external circuitry (not shown), substrate 54 includes one or more connectors 60. Each connector 60 includes one or more electrically conductive leads 62 configured to be inserted into plated through holes 64 formed in substrate 54. When filled with a suitable conductive material 10, such tin-lead solder, for retaining conductive lead 62 therein, each plated through hole 64 facilitates contact between a corresponding conductive pad 58 on one side of substrate 54 and the conductive lead 62 received therein. Each connector 60 can be formed from non-magnetic materials that are not affected by magnetic field 34 when substrate 54 is positioned in curing oven 12. However, this is not to be construed as limiting the invention.

In the embodiment shown in FIG. 6a, each connector 60 has the form of a female edge connector housing having a spring loaded portion 66 of each conductive lead 62 received along one of the vertical walls of a slot 68 formed therein. The spring loaded portions 66 of conductive leads 62 of each connector 60 are configured to mate with conductive portions of a male edge connector (not shown) configured to be inserted into slot 68 thereof. Male and female edge connectors of this type are well known in the art and will not be described further herein for simplicity of description.

The foregoing description of substrate 54 having one or more connectors 60 is not to be construed as limiting the invention since the use of any type of connector having conductive leads which can be electrically connected to conductive pads 58 of substrate 54 and which can be mated with a suitable mating connector is also envisioned.

Each connector 60 and corresponding mating edge connector (not shown) can be utilized to electrically connect pixels 56 of crystal 52 to suitable processing circuitry or electronics disposed off board substrate 54. Substrate 54 can also or alternatively include processing circuitry or electronics 69 deposited thereon for processing one or more electrical signals received from crystal 52 prior to conveying the processed output signals to one or more connectors 60.

The surface of each pixel 56 of crystal 52 shown in FIG. 6a includes a coating of a suitable conductive metal that facilitates contact between each pixel 56 and its corresponding conductive pad 58 of substrate 54. If crystal 52 is a planar crystal, the coating of metal would cover all or most of the surface of crystal 52 shown in FIG. 6a. Moreover, the side of crystal 52 not shown in FIG. 6a also includes a coating of a suitable conductive metal. Suitable conductive metals include platinum, gold, gold-platinum, and the like. In the foregoing description, substrate 54 was described as being a printed circuit board. This printed circuit board can be formed from fiberglass, ceramic, or other suitable materials known in the art.

With reference to FIG. 8, a second embodiment radiation detector 70 includes a semiconductor radiation detection crystal 72, like crystal 52, physically and electrically connected to a patterned or top side of an integrated circuit 74 via anisotropic conductive material 10. If crystal 72 is pixilated, as shown in FIG. 9a, each pixel 73 thereof is in electrical communication with a corresponding conductive element or pad 75, shown in FIG. 9b, formed on the patterned side of integrated circuit 74 via anisotropic conductive material 10. However, if crystal 72 is a planar crystal, the patterned side of integrated circuit 74 can have a film of conductive material thereon or may only include one or a plurality of conductive elements or pads 75 for making electrical contact with the metalized surface of crystal 72 via anisotropic conductive material 10.

The unpatterned side of integrated circuit 74 can be electrically connected to a conductive part of a substrate 76, such as a printed circuit board, via a suitable conductive adhesive, such as anisotropic conductive material 10.

If desired, integrated circuit 74 can include suitable processing electronics or circuitry 77 formed on the patterned side thereof for processing one or more electrical signals output by crystal 72 in response to interaction thereby with suitable forms of radiation and/or particles. Processing electronics 77 can be in electrical communication with pixels 73 on the surface of crystal 72 in opposition with the patterned side of integrated circuit 74 via the conductive elements or pads 75 formed on patterned side of integrated circuit 74 and anisotropic conductive material 10.

To facilitate electrical connection between substrate 76 and processing electronics 77 and/or conductive elements or pads 75 of integrated circuit 74, a side or edge of integrated circuit 74 can extend outward from beneath crystal 72 as shown in FIG. 8. The extended side or edge of integrated circuit 74 includes contact pads 78 which can be electrically connected to processing electronics 77 and/or conductive elements or pads 75 formed on the patterned side of integrated circuit 74. To facilitate electrical communication between processing electronics 77 and/or contact pads 78 of integrated circuit 74 with one or more connectors (not shown) and/or processing electronics 81 disposed on substrate 76, a side or edge of substrate 76 can extend outward from beneath integrated circuit 74 as shown in FIG. 8. This extended side or edge of substrate 76 includes contact pads 80 which can be electrically connected to contact pads 78 of integrated circuit 84 via wire bonds 82. In addition, substrate 76 can include a contact pad 84 that is electrically connected to the exposed surface of crystal 72 via a wire bond 86. Contact pads 80 and 84 can, in-turn, be electrically connected to a connector (not shown) and/or processing electronics 81 disposed on substrate 76.

As shown in FIG. 8, the side or edge of integrated circuit 74 extending from beneath crystal 72 and the side or edge of substrate 76 extending from beneath integrated circuit 74 form a stair step arrangement. This stair step arrangement facilitates the use of wire bonds 82 and 86 to electrically connect crystal 72, integrated circuit 74 and substrate 76 in a suitable manner.

Substrate 76 can be connected to suitable mounting hardware and/or electrical hardware in any number of manners known to those of ordinary skill in the art. For example, the side of substrate 76 opposite crystal 72 can be positioned on a mounting substrate (not shown) of a radiation detection instrument. Moreover, the side or edge of substrate 76 extending from beneath integrated circuit 74 can include one or more connectors (not shown) which can be coupled to mating connectors which are electrically connected to external processing electronics (not shown).

With reference to FIGS. 10 and 11, and with continuing reference to FIG. 8, a plurality of second embodiment radiation detectors 70 can be positioned in an array in the manner shown in FIG. 10 to form a large area radiation detector 88. A larger area radiation detector 90 can be formed by overlapping the wire bond ends of the second embodiment radiation detector 70 forming radiation detector 88 with additional second embodiment radiation detectors 70 in the manner shown in FIG. 11. To avoid damaging wire bonds 82 of the overlapped second embodiment radiation detectors 70 of radiation detector 90, these wire bonds 82 can be encapsulated in suitable potting material or suitable fixturing (not shown) can be provided to maintain the overlapping second embodiment radiation detectors 70 spaced from the wire bonds 82 and 86 of the overlapped second embodiment radiation detectors 70.

Anisotropic conductive material 10 utilized in connection with second embodiment radiation detector 70 can be cured in a manner discussed above in connection with FIG. 3. Namely, each second embodiment radiation detector 70 can be positioned in curing oven 12 in the presence of magnetic field 34. Curing oven 12 can be heated or preheated to a suitable curing temperature for anisotropic conductive material 10 and the assembly subjected to this curing temperature for a suitable curing interval while in the presence of magnetic field 34.

To avoid relative movement between crystal 72, integrated circuit 74 and substrate 76 of second embodiment radiation detector 70 during curing of anisotropic conductive material 10, a UV curable adhesive 11 can be deposited between crystal 72 and integrated circuit 74 and between integrated circuit 74 and substrate 76. This UV curable adhesive 11 can then be exposed to UV light from one or more light sources L for a sufficient interval to cause UV curable adhesive 11 to commence curing. As discussed above, anisotropic conductive material 10 can also include a UV curable component whereupon exposure to the UV light from the one or more light sources L also causes this component to commence curing. After exposure to UV light, each second embodiment radiation detector 70 can be positioned in curing oven 12 in the presence of magnetic field 34 in the manner described above.

To avoid damage thereto due to relative movement between integrated circuit 74 and substrate 76 during curing of anisotropic conductive material 10 in curing oven 12, wire bonds 82 and 86 can be installed after curing anisotropic conductive material 10 of second embodiment radiation detector 70. However, this is not to be construed as limiting the invention.

The description of the first and second embodiment radiation detectors 50 and 70 discussed above in connection with FIGS. 6–11 are for the purpose of illustrating the use of anisotropic conductive material 10 to bond semiconductor radiation detection crystals to a substrate, such as a printed circuit board or an integrated circuit. The above described first and second embodiment radiation detectors 50 and 70, however, are not to be construed in any manner as limiting the present invention since other forms of substrates and/or integrated circuits known in the art can be joined to radiation detection crystals without departing from the spirit and scope of the present invention.

As shown in FIG. 1, anisotropic conductive material 10 includes an electrically conducting material 40 suspended in a binder 42. Electrically conducting material 40 includes one or more types of particles coated with a noble metal such as gold or silver. The particles forming electrically conducting material 40 can include one or more of the following: solid nickel coated spheres, solid nickel flakes, solid carbon/graphite spheres, solid glass spheres, solid mica particles or flakes and hollow glass spheres. As used herein, the terms sphere or spheres generally means that the particles are ball-shaped, egg-shaped or minor variations of ball-shaped and egg-shaped.

The solid carbon/graphite spheres, the solid glass spheres, the solid mica particles or flakes and the hollow glass spheres each include a coating of nickel between the outside surface of the sphere and the coating of noble metal. The coating of nickel on these otherwise non-magnetic materials renders them susceptible to the influence of magnetic field 34.

Each particle along with the one or more coatings thereon has a maximum dimension less than 100 μm, preferably less than 80 μm and more preferably between 10 μm and 25 μm. As used herein, the term "maximum dimension" means the largest dimension of the particle measured in any direction. For example, if a particle is a sphere, the maximum dimension is the outside diameter of the noble metal deposited on the sphere. If the particle is a flake having an irregular shape, the maximum dimension is the dimension between the two points of the noble metal deposited over the particle that are farthest apart.

It has been observed that particles having an average maximum dimension between 10 μm and 25 μm enables the formation of parallel isolated conductive paths between adjacent pairs of aligned contacts having an edge-to-edge spacing as close as 80 μm. Obviously, a plurality of particles having this average maximum dimension will have some particles having a maximum dimension less than 10 μm, e.g., 5 μm, and some particles having a maximum dimension greater than 25 μm. To this end, it has been observed that in a population of particles forming electrically conducting material 40 with an average maximum dimension between 10 μm and 25 μm, some of the particles can have a maximum dimension as small as 5 μm.

A first embodiment anisotropic conductive material 10 includes binder 42 formed from the reaction product of between 82% and 91% by weight of a compound and no more than about 6% by weight of a catalyst. The compound includes about one-third by weight of each of an aromatic epoxy resin, a dimer fatty acid diglycidyl ester and an oxirane. Any suitable aromatic epoxy resin may be used in the compound. Suitable aromatic epoxy resins include, but are not limited to diglycidyl ethers of bisphenol-A and bisphenol-F and other such resins, such as those available from EPON Resins from Resolution Performance Products, Houston, Tex. Any suitable dimer fatty acid diglycidyl ester may be used in the compound. Suitable dimer fatty acid diglycidyl esters include those of the formula:

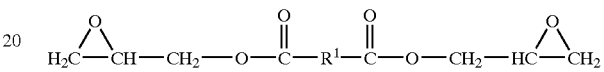

where R is $C_1$–$C_{20}$ alkylene, arylene or alkarylene.

Any suitable oxirane may be used in the compound. Suitable oxiranes include those of the formula:

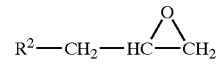

where $R^2$ is linear or branched $C_1$–$C_{20}$, alkyl, aryl, alkaryl, or is derived from a poly ether of the formula:

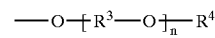

where $R^3$ is a linear or branched $C_1$–$C_{12}$ alkylene and $R^4$ is a linear or branched $C_1$–$C_{20}$ alkyl, aryl or alkaryl group, and "n" is an integer from 1 to 100. In an embodiment of the invention, the oxirane is (butoxy methyl)-butyl glycidyl ether. In one non-limiting embodiment, the aromatic epoxy resin is the reaction product of about one-half by weight of each of bisphenol-A and epichlorohydrin. In one non-limiting embodiment, the catalyst includes a quaternary cyanyl R-substituted amine. The R group in the quaternary cyanyl R-substituted amine may be a $C_1$–$C_{20}$ linear or branched alkyl, aryl or aralkyl group. In this first embodiment anisotropic conductive material 10, electrically conducting material 40 includes between 2.5% and 7% by weight of solid nickel spheres coated with silver and between 2.5% and 7% by weight of solid nickel flakes coated with silver.

A second embodiment anisotropic conductive material 10 includes the same electrically conducting material as the first embodiment anisotropic conductive material 10 and a binder similar to binder 42 in the first embodiment anisotropic conductive material 10 described above except that the binder in this second embodiment includes about 10% by weight of a UV curable modifier which replaces a corresponding weight percentage of the compound. More specifically, binder 42 in the second embodiment anisotropic conductive material 10 is formed from the reaction product of the UV curable modifier, the catalyst and the above described compound. The UV modifier can be UV curable adhesive 11 of the type commonly used in the art to attach integrated circuit packages to substrates. One exemplary UV curable modifier is formed from the reaction product of between 8% and 12% by weight of a (meth)acrylate ester, between 76% and 84% by weight of (meth)acrylated urethane and between 4% and 5% by weight of a hydroxy alkyl aryl ketone.

Any suitable (meth)acrylate ester may be used in the UV curable modifier. Suitable (meth)acrylate esters include those of the formula of:

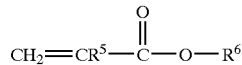

where $R^5$ is H or methyl and $R^6$ is a linear, branched or cyclic $C_1$–$C_{20}$ alkyl, aryl, alkaryl or aralkyl group. In an embodiment of the UV curable modifier, the (meth)acrylate ester is isobutyl (meth)acrylate. Any suitable hydroxy alkyl aryl ketone may be used in the UV curable modifier. Suitable hydroxy alkyl aryl ketones include those of the formula:

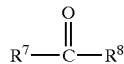

Where $R^7$ is a linear, branched or cyclic $C_2$–$C_{20}$ alkyl group containing at least one hydroxyl group and $R^8$ is a $C_6$–$C_{20}$ aryl, alkaryl or aralkyl group. In an embodiment of the UV curable modifier, the hydroxy alkyl aryl ketone is 1-hydroxy cycohexyl phenyl ketone.

A third embodiment anisotropic conductive material 10 includes binder 42 formed from the reaction product of between 8% and 12% by weight of the compound described above, between 71% and 79% of a phenolic resin, no more than about 6% by weight of a catalyst, such as a quaternary cyanyl R-substituted amine, and no more than about 12% by weight of the UV modifier system. Any suitable phenolic resin may be used. Suitable phenolic resins include, but are not limited to, novalac resins and revol resins. In an embodiment of the invention, the phenolic resin is a novalac resin formed as the reaction product of formaldehyde and one or more of phenol, cresol, bisphenol-A and bisphenol-F. The quaternary cyanyl R-substituted amine is as described above. This binder 42 is mixed with about 14% by weight of an electrically conducting material 40 to form the third embodiment anisotropic conductive material 10. In this embodiment, electrically conducting material 40 is solid nickel spheres coated with gold.

A fourth embodiment anisotropic conductive material 10 includes binder 42 formed from the reaction product of between 71% and 79% by weight of phenolic resin, as described above, 8% to 12% by weight of a thermally polymerized aromatic epoxy resin and no more than about 6% by weight of a catalyst, such as quaternary cyanyl R-substituted amine as described above. The electrically conducting material 40 added to this fourth embodiment binder 42 to form anisotropic conductive material 10 includes about 10% by weight of solid carbon/graphite spheres having a coating of gold over a coating of nickel and about 4% by weight of solid glass spheres having a coating of gold over a coating of nickel.

A fifth embodiment anisotropic conductive material 10 includes binder 42 formed from the reaction product of between 71% and 79% by weight of a phenolic resin, as described above, 8% to 12% by weight of a phenoxy modified epoxy novalac resin and no more than about 6% by weight of a catalyst, such as quaternary cyanyl R-substituted amine as described above. The electrically conducting material 40 of the fifth embodiment anisotropic conductive material 10 includes about 10% by weight of solid carbon/graphite spheres having a coating of gold over a coating of nickel and about 4% by weight of solid glass spheres having a coating of gold over a coating of nickel.

When the particles comprising electrically conducting material 40 of the first through fifth embodiments of anisotropic conductive material 10 have an average maximum dimension between 10 μm and 25 μm and when each of these anisotropic conductive materials 10 are cured in the above described manner, adjacent parallel isolated conductive paths having an edge-to-edge spacing as close as 80 μm were observed in cross sections of the cured anisotropic conductive material 10. The isolation of these adjacent parallel isolating conductive paths was confirmed by electrical measurement thereof.

The first through fifth embodiments of anisotropic conductive material 10 were utilized to attach 20 pin integrated circuits to substrates and to electrically connect each contact of the integrated circuit to a corresponding contact of the substrate to which the integrated circuit was attached. The contact resistance between one or more contacts of each integrated circuit and the corresponding embodiment of anisotropic conductive material 10 were measured and the following results were observed. The first through third embodiments of anisotropic conductive material 10 exhibited a higher contact resistance than the fourth and fifth embodiments of anisotropic conductive material 10. In addition, the first through third embodiments of anisotropic conductive material exhibited a contact resistance that varied as much as one order of magnitude greater than the contact resistance variance of the fourth and fifth embodiments of anisotropic conductive material 10. More specifically, the contact resistance of the first through third embodiments of anisotropic conductive material 10 varied up to 20%. In contrast, the contact resistance of the fourth and fifth embodiments of anisotropic conductive material 10 varied between 2% and 4%.

Moreover, the stability of the contact resistance of the first through third embodiments of anisotropic conductive material 10 increased or decreased by as much as 60% when exposed to 95% relative humidity at 40° C. for 1,000 hours. Furthermore, when the first through third embodiments of anisotropic conductive material 10 were exposed to 60° C. for 1,000 hours, the contact resistance increased or decreased by as much as 15%. Lastly, when the first through third embodiments of anisotropic conductive material 10 were exposed to a temperature of −40° C. for 1,000 hours, the contact resistance increased or decreased by as much as 20%.

In contrast, the contact resistance of the fourth and fifth embodiments of anisotropic conductive material 10 increased or decreased by only about 7% when exposed to 95% relative humidity at 40° C. for 1,000 hours. Moreover, when the fourth and fifth embodiments of anisotropic conductive material 10 were exposed to a temperature of 60° C. for 1,000 hours, the contact resistance of each contact increased or decreased only about 5%. Lastly, when the fourth and fifth embodiments of anisotropic conductive material 10 were exposed to a temperature of −40° C. for 1,000 hours, the contact resistance of each contact increased or decreased only about 5%.

The foregoing embodiments of anisotropic conductive material 10 have a viscosity between 30,000 centi-poise and 45,000 centi-poise at 25° C. and a viscosity of less than 50 centi-poise between 75° C. and 150° C. This drastic change in viscosity in combination with the exposure of anisotropic conductive material 10 to a suitable curing temperature in the presence of magnetic field 34 enables the electrically conducting material 40 suspended in binder 42 to align under the influence of magnetic field 34 to form adjacent, but electrically isolated, parallel conductive paths between adjacent pairs of aligned contacts having an edge-to-edge spacing as close as 80 µm.

It is believed that electrically conducting material 40 formed from solid mica particles or flakes and/or hollow glass spheres having a coating of noble metal, such as gold or silver, over a coating of nickel will reduce the edge-to-edge spacing of adjacent parallel isolated conductive paths that can be realized over the edge-to-edge spacing realized utilizing similarly sized solid nickel spheres coated with a coating of noble metal, solid carbon/graphite spheres having a coating of noble metal over a coating of nickel and/or solid glass spheres having a coating of noble metal over a coating of nickel. To this end, it is believed that the lower weight of the solid mica particles or flakes and/or the hollow glass spheres enables them to move more readily under the influence of magnetic field 34 before binder 42 hardens sufficiently to prevent their movement under the influence of magnetic field 34.

Obviously, smaller particle sizes forming electrically conducting material 40 of anisotropic conductive material 10 enables conductive paths to be formed between adjacent pairs of aligned contacts having a closer edge-to-edge spacing than larger particles. Thus, increasing and decreasing the average maximum dimension of the particles forming electrically conducting material 40 of anisotropic conductive material 10, increases and decreases the edge-to-edge spacing of adjacent pairs of aligned contacts that can be electrically connected by adjacent conductive paths without experiencing shorting between the adjacent conductive paths.

The present invention has been described with reference to the preferred embodiments. Obvious modifications and alterations will occur to others upon reading and understanding the preceding detailed description. It is intended that the invention be construed as including all such modifications and alterations insofar as they come within the scope of the appended claims or the equivalents thereof.

The Invention is claimed to be:

1. A radiation detector assembly comprising:
a crystal for converting incident radiation or an incident particle into an electrical signal;
a first substrate for conveying the electrical signal to processing electronics; and
anisotropic conductive material sandwiched between the crystal and the first substrate for conducting the electrical signal from the crystal to the substrate, said anisotropic conductive material comprising an electrically conducting material suspended in a binder formed from the reaction product of one of (i) a catalyst and a compound comprising about one-third by weight of each of an aromatic epoxy resin, a dimer fatty acid diglycidyl ester and an oxirane, (ii) a phenolic resin, a catalyst and a thermally polymerized aromatic epoxy resin and (iii) a phenolic resin, a catalyst and a phenoxy modified epoxy novalac resin.

2. The assembly of claim 1, wherein:
the crystal defines on a surface thereof an array of pixels, with each pixel responsive to incident radiation or an incident particle for producing a corresponding electrical signal;
the first substrate includes on a surface thereof an array of conductive pads; and
the surface of the crystal and the surface of the first substrate are positioned in opposition with the anisotropic conductive material sandwiched therebetween and with each pixel in alignment with a corresponding conductive pad, the an isotropic conductive material forming between each pixel and its corresponding conductive pad an electrical path, with each electrical path isolated from other electrical paths.

3. The assembly of claim 1, wherein the first substrate is one of a printed circuit board and an integrated circuit.

4. The assembly of claim 3, wherein the integrated circuit includes the processing electronics.

5. The assembly of claim 1, wherein the processing electronics is included on the first substrate.

6. The assembly of claim 3, further including a second substrate received on a side of the integrated circuit opposite the crystal with anisotropic conductive material sandwiched between the second substrate and the integrated circuit, the second substrate including contact pads electrically connected to contact pads formed on the integrated circuit.

7. The assembly of claim 6, wherein:
the crystal is positioned in opposition with a top surface of the integrated circuit;
the second substrate is positioned in opposition with a bottom surface of the integrated circuit; and
wire bonds form the electrical connections between the contact pads of the second substrate and the contact pads of the integrated circuit.

8. The assembly of claim 1, wherein the crystal is formed from one of cadmium zinc telluride, cadmium telluride, zinc telluride, mercuric iodide, lead iodide and germanium.

9. The assembly of claim 1, wherein:
the incident radiation is one of x-radiation and gamma radiation; and
the incident particle is one of an alpha particle and a beta particle.

10. The assembly of claim 1, wherein the oxirane is a (butoxy methyl)-butyl glycidyl ether.

11. The assembly of claim 1, wherein the compound includes about one-third by weight of each of the aromatic epoxy resin, the dimer fatty acid diglycidyl ester and the oxirane.

12. The anisotropic conductive material as set forth in claim 1, wherein the catalyst includes a quaternary cyanyl R-substituted amine.

13. The assembly of claim 1, wherein the aromatic epoxy resin is formed from the reaction product of bisphenol-A and epichlorohydrin.

14. The assembly of claim 1, wherein the conductive material includes between 82% and 91% by weight of the compound and no more than 6% by weight of the catalyst.

15. The assembly of claim 1, wherein the binder further includes a UV curable modifier.

16. The assembly of claim 15, wherein the UV curable modifier is formed from the reaction product of between 8% and 12% by weight of a (meth)acrylate ester, between 76% and 84% by weight of a (meth)acrylated urethane and between 4% and 5% by weight of a hydroxy alkyl aryl ketone.

17. The assembly of claim 16, wherein the hydroxy alkyl aryl ketone is 1-hydroxy cyclohexyl phenyl ketone.

18. The assembly of claim 16, wherein the (meth)acrylate ester is isobutyl acrylate.

19. The assembly of claim 15, wherein said material includes between 72% and 81% by weight of the compound, no more than 4% by weight of the catalyst and no more than 10% by weight of the UV curable modifier.

20. The assembly of claim 1, wherein the electrically conducting material includes gold or silver coated nickel particles.

21. The assembly of claim 20, wherein the gold or silver coated nickel particles include about 50% by weight of gold or silver coated nickel spheres and about 50% by weight of gold or silver coated nickel flakes.

22. The assembly of claim 20, wherein an average maximum dimension of the particles including their coatings is between 10 $\mu$m and 25 $\mu$m.

23. The assembly of claim 20, wherein said material includes between 5% and 14% by weight of the electrically conducting material.

24. The assembly of claim 15, wherein the binder further includes a phenolic resin.

25. The assembly of claim 24, wherein the phenolic resin is a novalac resin formed from the reaction product of formaldehyde and one of phenol, cresol and bisphenol-A.

26. The assembly of claim 23, wherein said material includes between 8% and 12% by weight of the compound, between 71% and 79% by weight of the phenolic resin, no more than 6% by weight of the catalyst and no more than 12% by weight of the UV modifier system.

27. The anisotropic conductive material as set forth in claim 1, wherein the phenolic resin is a novalac resin.

28. The anisotropic conductive material as set forth in claim 27, wherein each novalac resin is comprised of the reaction product of formaldehyde and one of phenol, cresol and bisphenol-A.

29. The anisotropic conductive material as set forth in claim 1, wherein said binder includes between 71% and 79% by weight of the phenolic resin, no more than 6% by weight of the catalyst and between 8% and 12% by weight of the thermally polymerized aromatic epoxy resin or the phenoxy modified epoxy novalac resin.

30. The anisotropic conductive material as set forth in claim 1, wherein the electrically conducting material includes nickel coated particles having a coating of silver or gold over the nickel coat.

31. The anisotropic conductive material as set forth in claim 30, wherein the particles include at least two of (i) carbon/graphite spheres, (ii) glass spheres and (iii) mica particles.

32. The anisotropic conductive material as set forth in claim 31, wherein the glass spheres are one of solid and hollow.

33. The anisotropic conductive material as set forth in claim 31, wherein an average maximum dimension of the particles including their coatings is between 10 $\mu$m and 25 $\mu$m.

34. The anisotropic conductive material as set forth in claim 30, wherein said material includes between 12% and 16% by weight of the electrically conducting material.

35. A radiation detector assembly comprising:
a crystal for converting incident radiation or an incident particle into an electrical signal;
a first substrate for conveying the electrical signal to processing electronics; and
anisotropic conductive material sandwiched between the crystal and the first substrate for conducting the electrical signal from the crystal to the substrate, said anisotropic conductive material configured to be cured in the presence of a magnetic field, said anisotropic conductive material comprising electrically conducting material suspended in a binder, said electrically conducting material comprising a plurality of non-magnetic particles, each of which is coated with a layer of magnetically susceptible material and a layer of electrically conductive material, said electrically conducting material forming electrically conductive and isolated parallel paths when cured in the presence of a magnetic field.

36. The assembly of claim 35, wherein the particles include at least two of (i) carbon/graphite spheres, (ii) glass spheres and (iii) mica particles.

37. The assembly of claim 36, wherein the glass spheres are one of solid and hollow.

38. The assembly of claim 35, wherein the particles have a spherical shape.

39. The assembly of claim 35, wherein an average maximum dimension of the particles including their coatings is between 10 $\mu$m and 25 $\mu$m.

40. The assembly of claim 35, wherein the binder is formed from the reaction product of a catalyst and compound comprising an aromatic epoxy resin, a dimer fatty acid diglycidyl ester and an oxirane.

41. The assembly of claim 40, wherein the oxirane is a (butoxy methyl)-butyl glycidyl ether.

42. The assembly of claim 40, wherein the binder includes about one-third by weight of each of the aromatic epoxy resin, the dimer fatty acid diglycidyl ester and the oxirane.

43. The assembly of claim 40, wherein the catalyst includes a quaternary cyanyl R-substituted amine.

44. The assembly of claim 40, wherein the aromatic epoxy resin is formed from the reaction product of bisphenol-A and epichlorohydrin.

45. The assembly of claim 40, wherein the binder further includes a UV curable modifier.

46. The assembly of claim 45, wherein the binder further includes a phenolic resin.

47. The assembly of claim 45, wherein the phenolic resin is a novalac resin.

48. The assembly of claim 47, wherein the novalac resin is formed from the reaction product of formaldehyde and one of phenol, cresol and bisphenol-A.

49. The assembly of claim 35, wherein the binder is formed from the reaction product of a phenolic resin, a catalyst and one of (i) a thermally polymerized aromatic epoxy resin and (ii) a phenoxy modified epoxy novalac resin.

50. The assembly of claim 49, wherein the phenolic resin is a novalac resin.

51. The assembly of claim 49, wherein the phenolic resin and the novalac resin are formed from the reaction product of formaldehyde and one of phenol, cresol and bisphenol-A.

52. The assembly of claim 35, wherein:
the crystal defines on a surface thereof an array of pixels, with each pixel responsive to incident radiation or an incident particle for producing a corresponding electrical signal;
the first substrate includes on a surface thereof an array of conductive pads; and
the surface of the crystal and the surface of the first substrate are positioned in opposition with the anisotropic conductive material sandwiched therebetween and with each pixel in alignment with a corresponding conductive pad, the anisotropic conductive material forming between each pixel and its corresponding conductive pad an electrical path, with each electrical path isolated from other electrical paths.

53. The assembly of claim 35, wherein the first substrate is one of a printed circuit board and an integrated circuit.

54. The assembly of claim 53, wherein the integrated circuit includes the processing electronics.

55. The assembly of claim 35, wherein the processing electronics is included on the first substrate.

56. The assembly of claim 53, further including a second substrate received on a side of the integrated circuit opposite the crystal with anisotropic conductive material sandwiched between the second substrate and the integrated circuit, the second substrate including contact pads electrically connected to contact pads formed on the integrated circuit.

57. The assembly of claim 56, wherein:

the crystal is positioned in opposition with a top surface of the integrated circuit;

the second substrate is positioned in opposition with a bottom surface of the integrated circuit; and wire bonds form the electrical connections between the contact pads of the second substrate and the contact pads of the integrated circuit.

58. The assembly of claim 35, wherein the crystal is formed from one of cadmium zinc telluride, cadmium telluride, zinc telluride, mercuric iodide, lead iodide and germanium.

59. The assembly of claim 35, wherein:

the incident radiation is one of x-radiation and gamma radiation; and the incident particle is one of an alpha particle and a beta particle.

* * * * *

UNITED STATES PATENT AND TRADEMARK OFFICE
CERTIFICATE OF CORRECTION

PATENT NO. : 6,909,100 B2
DATED : June 21, 2005
INVENTOR(S) : Sognefest et al.

It is certified that error appears in the above-identified patent and that said Letters Patent is hereby corrected as shown below:

Title page,
Item [57], ABSTRACT,
Line 6, "can array of pixels" should read -- an array of pixels --.

Column 16,
Line 3, "the an isotropic conductive" should read -- the anisotropic conductive --.

Signed and Sealed this

Third Day of January, 2006

JON W. DUDAS
*Director of the United States Patent and Trademark Office*